United States Patent
Yu et al.

(10) Patent No.: US 12,242,925 B2
(45) Date of Patent: Mar. 4, 2025

(54) QUANTUM CIRCUIT BUFFERING

(71) Applicant: International Business Machines Corporation, Armonk, NY (US)

(72) Inventors: Jessie Yu, Wappingers Falls, NY (US); Ryan Woo, Tenafly, NJ (US); Atsuko Shimizu, Mount Kisco, NY (US); Kang Bae, Ridgefield, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 567 days.

(21) Appl. No.: 17/551,923

(22) Filed: Dec. 15, 2021

(65) Prior Publication Data

US 2023/0186130 A1    Jun. 15, 2023

(51) Int. Cl.
*G06F 30/39*    (2020.01)
*G06N 10/20*    (2022.01)
*G06N 10/80*    (2022.01)

(52) U.S. Cl.
CPC .............. *G06N 10/20* (2022.01); *G06F 30/39* (2020.01); *G06N 10/80* (2022.01)

(58) Field of Classification Search
USPC ........................................ 716/118, 119, 126
See application file for complete search history.

(56) References Cited

U.S. PATENT DOCUMENTS 10,768,939 B2    9/2020    Yu et al.
10,997,519 B2    5/2021    Gunnels et al.
(Continued)

FOREIGN PATENT DOCUMENTS

WO    2020056176 A1    3/2020
WO    2020081805 A1    4/2020
WO    2020/172504 A1    8/2020

OTHER PUBLICATIONS

International Search Report and Written Opinion for International Application No. PCT/CN2022/108175 dated Oct. 26, 2022.
(Continued)

*Primary Examiner* — Brian Ngo
(74) *Attorney, Agent, or Firm* — Amin, Turocy & Watson, LLP

(57) ABSTRACT

One or more systems, devices, computer program products and/or computer-implemented methods of use provided herein relate to usage maximization of a physical qubit layout of a quantum computer. A system can comprise a memory that stores computer executable components, and a processor that executes the computer executable components stored in the memory, wherein the computer executable components can comprise an identification component that identifies a quantum circuit, and a scheduler component that maps the quantum circuit to a physical qubit layout. In an embodiment, the scheduler component can combine plural quantum circuits, including the quantum circuit into a composite circuit, and map the composite circuit to the physical qubit layout. In an embodiment, an obtaining component can assign the quantum circuit to a temporary storage bucket and can identify whether the temporary storage bucket meets a threshold where the scheduler component can proceed to analyze the quantum circuit.

20 Claims, 10 Drawing Sheets

(56) References Cited

U.S. PATENT DOCUMENTS

| | | | |
|---|---|---|---|
| 11,200,360 | B1 | 12/2021 | Bravyi et al. |
| 11,281,988 | B1* | 3/2022 | Naveh ............... G06N 10/00 |
| 2019/0042677 | A1* | 2/2019 | Matsuura ............ G06N 10/00 |
| 2020/0081805 | A1 | 3/2020 | Abraham et al. |
| 2020/0242208 | A1 | 7/2020 | Daraeizadeh et al. |
| 2020/0334563 | A1 | 10/2020 | Gambetta et al. |
| 2021/0152189 | A1 | 5/2021 | Murali et al. |
| 2021/0173988 | A1 | 6/2021 | Cao |
| 2023/0112525 | A1* | 4/2023 | Naveh ............... G06N 10/00 716/100 |

OTHER PUBLICATIONS

Niu, SiyuAn, and Aida Todri-Sanial, "Enabling Multi-Programming Mechanism for Quantum Computing in the NISQ Era," arXiv preprint arXiv:2102.05321 (2021), 15 pages.

Layeb, Abdesslem, and Seriel Rayene Boussalia, "A Novel Greedy Quantum Inspired Cuckoo Search Algorithm for Variable Sized Bin Packing Problem," International Journal of Mathematics in Operational Research 6.6 (2014): 732-751.

Tan et al., "Optimal Layout Synthesis for Quantum Computing" arXiv:2007.15671v1 [cs.AR] Jul. 30, 2020 (10 pages).

Angelopoulos et al., "Online Bin Packing with Predictions" arXiv:2102.03311v1 [cs.DS] Feb. 5, 2021 (14 pages).

Hedayati et al., "Multi-Queue Fair Queuing" Jul. 10-12, 2019 . Renton, WA, USA ISBN 978-1-939133-03-8 (15 pages).

Song et al., "Adaptive Resource Provisioning for the Cloud Using Online Bin Packing" IEEE Transactions on Computers, vol. 63, No. 11, Nov. 2014 (14 pages).

Bjorling et al., "Linux Block IO: Introducing Multi-queue SSD Access on Multi-core Systems" SYSTOR '13 Jun. 30-Jul. 2, 2013, Haifa, Israel (10 pages).

Mell et al., "The NIST Definition of Cloud Computing," Recommendations of the National Institute of Standards and Technology, NIST Special Publication 800-145, Sep. 2011, 7 pages.

MICRO-52: Proceedings of the 52nd Annual IEEE/ACM International Symposium on Microarchitecture, Oct. 2019, pp. 291-303, Das Pet al, "A Case for Multi-Programming Quantum Computers", 2019, https://doi.org/10. I145/3352460.3358287 (DAS), see figures 1, 6-8, 15 against claims 1, 4, 9, 12, 15, 18.

Arxiv.org, Dou X et al, "A New Qubits Mapping Mechanism for Multi-programming Quantum Computing", 2020, available from https://arxiv.org/pdf/2004.12854, (DOU) see figure 5 and section 11.D against claims 1, 9, 15.

Patents Act 1977: Examination Report under Section 18(3) for GB application No. GB2408668.8 dated Jul. 17, 2024.

Reply dated Aug. 1, 2024 to Patents Act 1977: Examination Report under Section 18(3) for GB application No. GB2408668.8 dated Jul. 17, 2024.

* cited by examiner

QUANTUM CIRCUIT BUFFERING

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

On a large scale, quantum computing cloud service providers can execute millions of quantum jobs for users during a year. Each quantum job can include the execution of one or more quantum programs at a physical logic circuit. Physical, real-world, quantum logic circuits controlled by a quantum system can include a plurality of qubits.

Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in one or more cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Also, on the large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate a process to maximize usage of physical qubits of a real-world physical qubit layout of a quantum computer.

In accordance with an embodiment, a system can comprise a memory that stores computer executable components, and a processor that executes the computer executable components stored in the memory, wherein the computer executable components can comprise an identification component that identifies a quantum circuit, and a scheduler component that maps the quantum circuit to a physical qubit layout.

In accordance with another embodiment, a computer-implemented method can comprise identifying, by a system operatively coupled to the processor, a quantum circuit, and mapping, by the system, the quantum circuit to a physical circuit layout.

In accordance with yet another embodiment, a computer program product facilitating a process to buffer one or more quantum circuits can comprise a computer readable storage medium having program instructions embodied therewith, the program instructions executable by a processor to cause the processor to identify, by the processor, a quantum circuit, and map, by the processor, the quantum circuit to a physical qubit layout.

An advantage of the aforementioned system, computer-implemented method and/or computer program product can be an increase in general overall throughput of a quantum system employing such embodiment, as compared to operation of one quantum program at a time. Indeed, use of physical qubits can be increased both by increasing number of qubits and by increasing available coherency time employed of one or more qubits of such quantum system.

In one or more embodiments, an obtaining component can obtain a quantum circuit and assign the quantum circuit to a temporary storage bucket. In this way, a general organization system of quantum circuits to be operated can be employed.

In one or more embodiments, an obtaining component can identify whether a temporary storage bucked meets a threshold such that the scheduler component can proceed to analyze the quantum circuit from the temporary storage bucket. In this way, processing power related to quantum circuit mapping to a physical quantum layout can be limited to a state when sufficient quantity of quantum circuits to maximize usage of a physical qubit layout have been identified, located and/or obtained.

DETAILED DESCRIPTION

Figure 1:
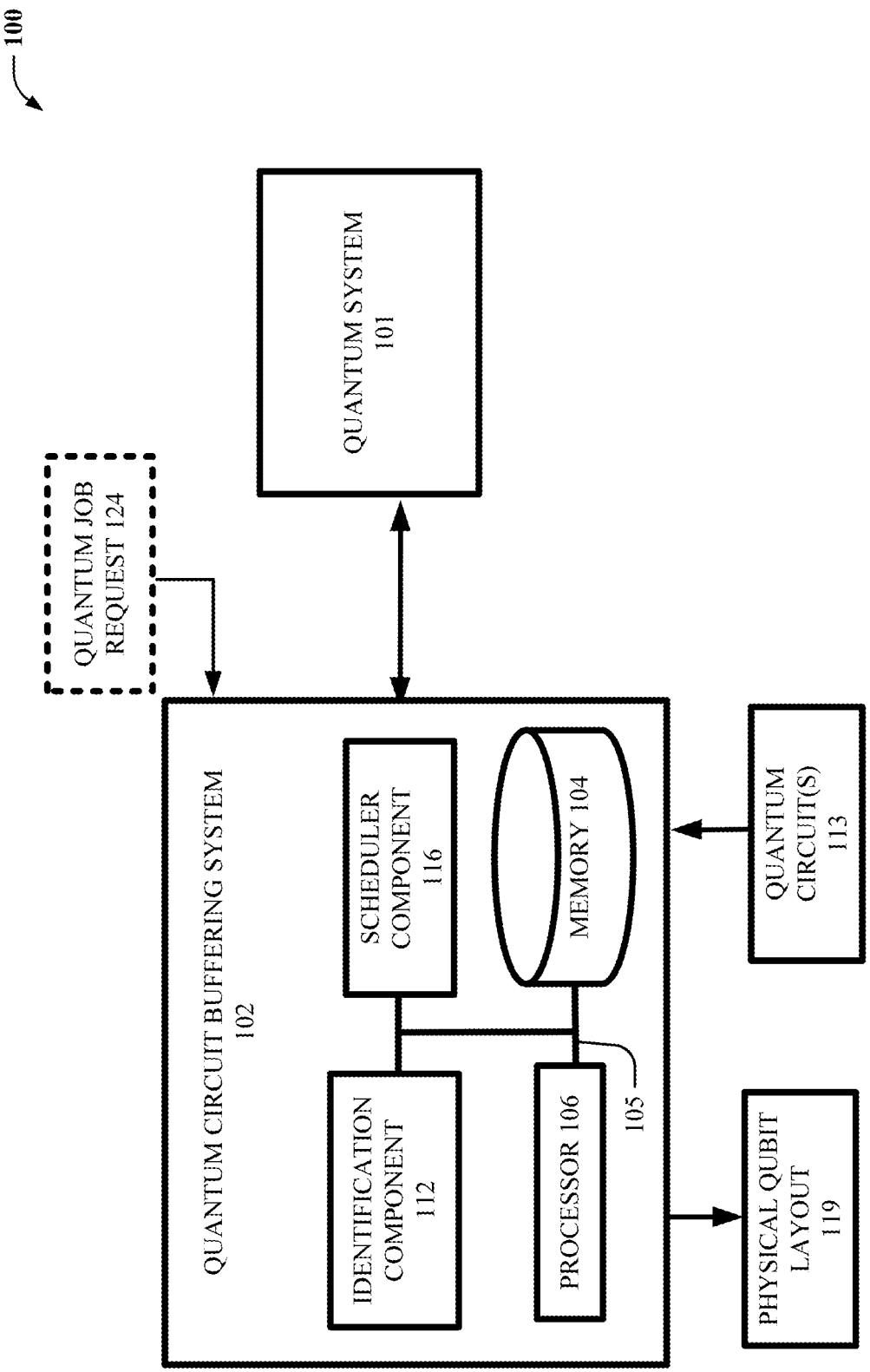
FIG. 1 illustrates a block diagram of an example, non-limiting system that can facilitate a process to buffer one or more quantum circuits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As used herein, a quantum circuit can be a set of operations, such as gates, performed on a set of real-world physical qubits with the purpose of obtaining one or more qubit measurements. Operation of the quantum circuit can be facilitated, such as by a waveform generator, to produce one or more physical pulses and/or other waveforms and/or frequencies to alter one or more states of one or more of the physical qubits. The altered states can be measured, thus allow for one or more computations to be performed.

Different quantum circuits can require varying resources. For example, one quantum circuit can use half of the total physical qubits of a quantum logic circuit of a respective quantum system. Another quantum circuit can use another half, or even another portion, of the available physical qubits of a same quantum system. That is, in general, operation of one quantum circuit at a time, relative to a physical qubit layout of many qubits, such as ten or more qubits, can waste processing power, available qubits and/or available qubit coherency. Less than all qubits can be used, allowing plural qubits to sit idle.

Because quantum processors and quantum systems are scarce and costly resources, such waste can be detrimental to both users and administrators of quantum systems, which can be underutilized. Put another way, each quantum processor can have a fixed number of qubits it supports, but the quantum circuits that can run on the fixed number of qubits can vary in complexity and size. When quantum circuits do not use the full capacity of a quantum processor, one or more qubits can remain idle, and thus it can be desired to facilitate a process to buffer one or more quantum circuit.

This buffering can comprise gathering of quantum circuits, mapping and/or remapping of such quantum circuits to a physical qubit layout of a quantum system, and performance of such quantum circuits in a specified order, where one or more quantum circuits can be run at least partially concurrently with one another. Further, one or more such quantum circuits can be run multiple times (e.g., multiple shots can be run), which shots of one quantum circuit being operated can overlap with operation of one, two, or even plural other quantum circuits (and/or shots thereof) being operated at a same physical qubit layout.

Determination of buffering can be based on one or more of a plurality of factors including proposed quantity of qubits to employ, number of shots to run, number of gates (e.g., swap gates) to be employed, execution time of a quantum circuit as compared to coherency time of qubits employed, circuit length/depth, time of a quantum circuit in a queue, hardware constraints, level of a user entity or customer, and/or the like. That is, one or more thresholds based on the quantum circuits, based on a hold time, and/or based on the entity requesting operation can be employed. One or more such thresholds can be employed concurrently, and threshold basis can be dynamically selectively altered. In this way, a most efficient usage of a quantum system can be provided, while providing a level of quantified fairness to user entities requesting usage of the quantum system. Indeed, such balancing can be desired in a case where a physical qubit layout exceeds ten or more qubits, such as comprising even a thousand or more qubits.

Described herein are one or more embodiments of a system, computer-implemented method and/or computer program products that can account for one or more deficiencies of existing techniques for optimization of performance of plural quantum circuits on one or more quantum systems. Generally, provided are one or more embodiments of a system, computer-implemented method and/or computer program product that can facilitate a process to buffer (e.g., obtain, analyze, and/or map) one or more quantum circuits relative to one or more physical qubit layouts. Further, training of a model, such as a machine learning (ML) model employed to balance such operation of quantum circuits can be facilitated after each iteration to continually improve upon usage of a physical qubit layout according to quantum program requests for usage of a quantum system comprising the physical qubit layout.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

Figure 2:
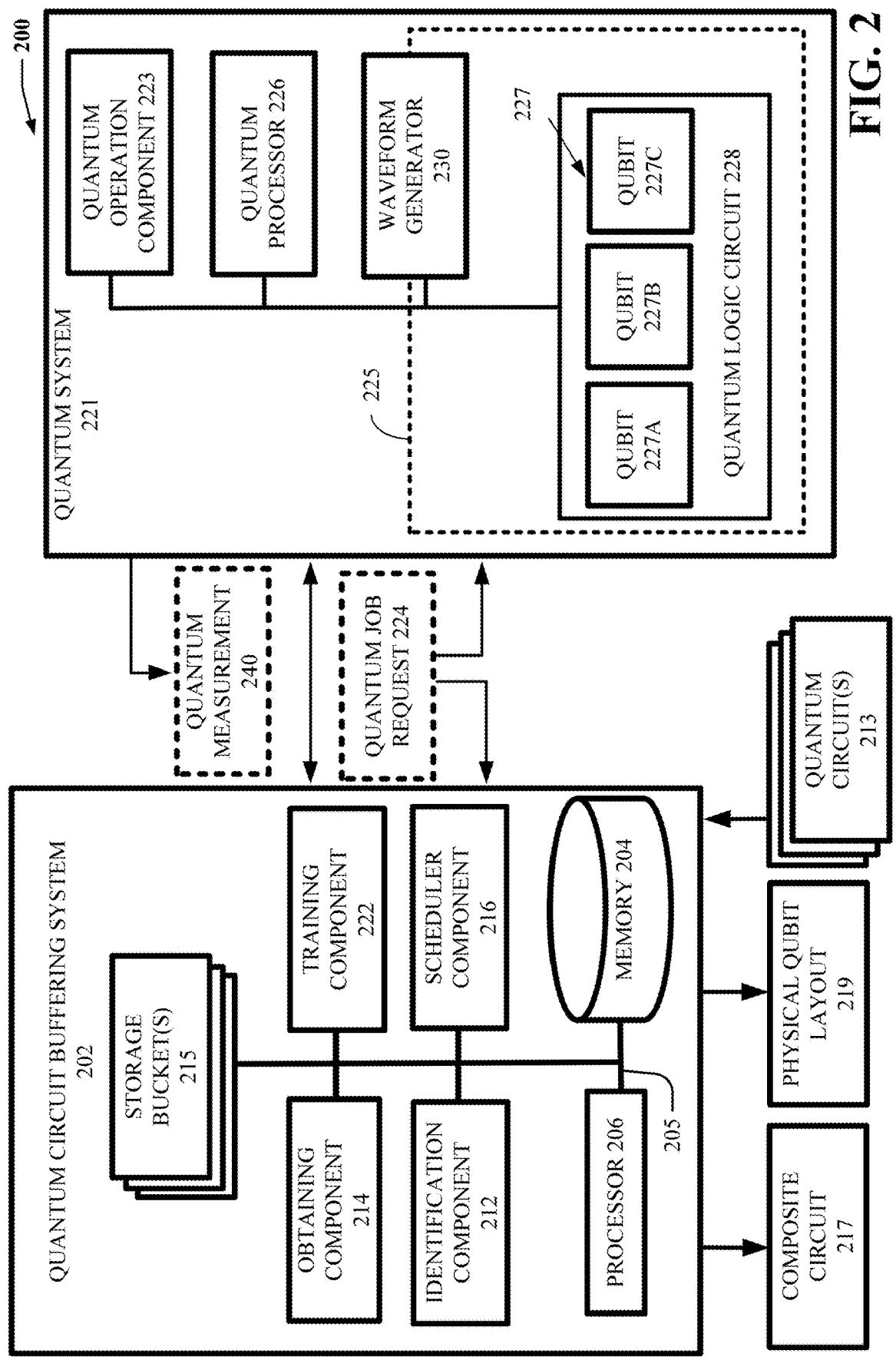
FIG. 2 illustrates a block diagram of another example, non-limiting system that can facilitate a process to buffer one or more quantum circuits, in accordance with one or more embodiments described herein.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting systems 100 and/or 200 as illustrated at FIGS. 1 and 2, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIGS. 1 and/or 2 and/or with other figures described herein.

Turning first generally to FIG. 1, one or more embodiments described herein can include one or more devices, systems and/or apparatuses that can facilitate quantum circuit buffering. For example, FIG. 1 illustrates a block diagram of an example, non-limiting system 100 that can employ a scheduler component, which can employ an ML model in one or more embodiments, to balance execution of plural quantum circuits relative to plural physical, real-world qubits of one or more physical qubit layouts of one or more quantum systems.

At FIG. 1, illustrated is a block diagram of an example, non-limiting system 100 that can facilitate such process, in accordance with one or more embodiments described herein. While referring here to one or more processes, facilitations and/or uses of the non-limiting system 100, description provided herein, both above and below, also can be relevant to one or more other non-limiting systems described herein, such as the non-limiting system 200, to be described below in detail.

As illustrated at FIG. 1, the non-limiting system 100 can comprise a quantum circuit buffering system 102. Quantum circuit buffering system 102 can comprise one or more components, such as a memory 104, processor 106, bus 105, identification component 112 and/or scheduler component 116. Generally, quantum circuit buffering system 102 can facilitate obtaining one or more quantum circuits 113 based on receipt of one or more quantum job requests 124. Employing one or more balancing processes, determination can be made of which one or more quantum circuits 113 to map and/or remap to a physical qubit layout 119.

The identification component 112, in response to receipt of a quantum job request 124 for operating a quantum circuit 113 on a quantum system 101, can receive, transfer, download, and/or otherwise obtain the quantum circuit 113. A copy of the quantum circuit 113 can be temporarily stored, internal and/or external to the quantum circuit buffering system 102.

The scheduler component 116 can, based on one or more factors of the quantum circuit 113, map and/or remap the quantum circuit to a physical qubit layout 119. As used herein, mapping can comprise fitting the quantum circuit to the actual physical qubit layout 119 to be employed, such as identifying same and/or different qubits (as compared to those identified at the quantum circuit), adding and/or merging gates, adding one or more swap gates and/or the like. Remapping can comprise a secondary mapping process that alters a mapping setup that can exist, such as in the form of metadata, relative to the obtained quantum circuit 113. For example, a quantum circuit 113 can have been initially designed and/or otherwise constructed to run on one physical qubit layout, different from the physical qubit layout 119 to be employed. The one or more factors can comprise proposed quantity of qubits to employ, number of shots to run, number of gates (e.g., swap gates) to be employed, execution time of a quantum circuit as compared to coherency time of qubits employed, circuit length/depth, time of a quantum circuit in a queue, hardware constraints, level of a user entity or customer, and/or the like.

One or more aspects of a component (e.g., the identification component 112 and/or the scheduler component 116) can be employed separately and/or in combination, such as employing one or more of a memory or a processor of a system that includes the component to thereby facilitate generation of the constraint variable and/or the influence mapping 115. That is, these components can employ the processor 106 and/or the memory 104. Additionally and/or alternatively, the processor 106 can execute one or more program instructions to cause the processor 106 to perform one or more operations by these components.

An advantage of the aforementioned system, computer-implemented method and/or computer program product can be an increase in general overall throughput of a quantum system employing such embodiment, as compared to operation of one quantum program at a time. Indeed, use of physical qubits can be increased both by increasing number of qubits and by increasing available coherency time employed of one or more qubits of such quantum system.

Turning next to FIG. 2, the figure illustrates a diagram of an example, non-limiting system 200 that can facilitate quantum circuit buffering. For example, FIG. 2 illustrates a block diagram of an example, non-limiting system 200 that can employ a scheduler component, which can employ an ML model in one or more embodiments, to balance execution of plural quantum circuits relative to plural physical, real-world qubits of one or more physical qubit layouts of one or more quantum systems. Repetitive description of like elements and/or processes employed in respective embodiments is omitted for sake of brevity. As indicated previously, description relative to an embodiment of FIG. 1 can be applicable to an embodiment of FIG. 2. Likewise, description relative to an embodiment of FIG. 2 can be applicable to an embodiment of FIG. 1.

In one or more embodiments, the non-limiting system 200 can be a hybrid system and thus can include both one or more classical systems, such as a quantum system 221 and a classical-based quantum circuit buffering system 202. In one or more other embodiments, the quantum system 221 can be separate from, but function in combination with, the classical system.

In such case, one or more communications between one or more components of the non-limiting system 200 (e.g., of the quantum system 221 and the quantum circuit buffering system 202) can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Generally, the quantum system 221 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuity can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 240, can be responsive to the quantum job request 224 and associated input data and can be based at least in part on the input data, quantum functions and/or quantum computations.

In one or more embodiments, the quantum system 221 can comprise one or more quantum components, such as a quantum operation component 223, a quantum processor 226, a waveform generator 230, and/or a quantum logic circuit 228 comprising a plurality of qubits 227 (e.g., qubits 227A, 227B and/or 227C), also referred to herein as qubit devices 227A, 227B and 227C.

The quantum processor 226 can be any suitable processor. The quantum processor 226 can generate one or more instructions for controlling the one or more processes of the quantum operation component 223 and/or for controlling the quantum logic circuit 228 and/or waveform generator 230.

The quantum operation component 223 can obtain (e.g., download, receive, search for and/or the like) a quantum job request 224 requesting execution of one or more quantum programs. The quantum operation component 23 can determine one or more quantum logic circuits, such as the quantum logic circuit 228, for executing the quantum program. The request 224 can be provided in any suitable format, such as a text format, binary format and/or another suitable format. In one or more embodiments, the request 224 can be received by a component other than a component of the quantum system 221, such as a by a component of a classical system coupled to and/or in communication with the quantum system 221.

The waveform generator 230 can perform one or more quantum processes, calculations and/or measurements for operating one or more quantum circuits on the one or more qubits 227A, 227B and/or 227C. For example, the waveform generator 230 can operate one or more qubit effectors, such as qubit oscillators, harmonic oscillators, pulse generators and/or the like to cause one or more pulses to stimulate and/or manipulate the state(s) of the one or more qubits 227A, 227B and/or 227C comprised by the quantum system 221. That is, the waveform generator 230, such as in combination with the quantum processor 226, can execute operation of a quantum logic circuit on the plurality of qubits 227 of the quantum logic circuit 108 (e.g., qubit 227A, 227B and/or 227C). In response, the quantum operation component 223 can output one or more quantum job results, such as one or more quantum measurements 240, in response to the quantum job request 224.

The quantum logic circuit 228 and a portion or all of the waveform generator 230 can be contained in a cryogenic environment, such as generated by a cryogenic chamber 225, such as a dilution refrigerator. Indeed, a signal can be generated by the waveform generator 230 within the cryogenic chamber 225 to affect one or more of the plurality of qubits 227. Where the plurality of qubits 227 are superconducting qubits, cryogenic temperatures, such as about 4K or lower can be employed to facilitate function of these physical qubits. Accordingly, the elements of the quantum measurement circuit 230 also are to be constructed to perform at such cryogenic temperatures.

The quantum logic circuit 228, and thus the qubits 227 can be comprised by the quantum processor 226.

Limiting and/or prevention of stray couplings between qubits and/or between a qubit and a coupler/bus, and/or minimization of cross talk between qubits, can be effected by a particular arrangement, such as a tiling arrangement (e.g., qubit layout) of the plurality of qubits 227, of the quantum logic circuit 228.

The following/aforementioned description(s) refer(s) to the operation of a single quantum program from a single quantum job request on a quantum logic circuit having a single arrangement. This operation can include one or more readouts from cryogenic environment electronics within cryogenic chamber 225 by room temperature control/readout electronics external to the cryogenic chamber 225. However, employment of the arrangement can be scalable such as where two or more such arrangements can be comprised by the quantum log circuit 228 in one or more embodiments. Such different arrangements can be effected by a same or different waveform generators. Further, one or more of the processes described herein can be scalable, also such as including additionally, and/or alternatively, execution of one or more quantum programs and/or quantum job requests in parallel with one another.

As illustrated, the non-limiting system 200 also can comprise a classical portion, comprising the quantum circuit buffering system 202. Generally, the quantum circuit buffering system 202, which, as illustrated, can comprise any suitable type of component, machine, device, facility, apparatus and/or instrument that comprises a processor and/or can be capable of effective and/or operative communication with a wired and/or wireless network. All such embodiments are envisioned. For example, quantum circuit buffering system 202 can comprise a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device. Likewise, the quantum circuit buffering system 202 can be disposed and/or run at any suitable device, such as, but not limited to a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device.

The quantum circuit buffering system 202 can be associated with, such as accessible via, a cloud computing environment. For example, the quantum circuit buffering system 202 can be associated with a cloud computing environment 950 described below with reference to FIG. 9 and/or with one or more functional abstraction layers described below with reference to FIG. 10 (e.g., hardware and software layer 1060, virtualization layer 1070, management layer 1080 and/or workloads layer 1090).

Operation of the non-limiting system 200 and/or of the quantum circuit buffering system 202 is not limited to use of a single quantum job result 240 and/or use of a single quantum circuit 213. Rather, operation of the non-limiting system 200 and/or of the quantum circuit buffering system 202 can be scalable. For example, the non-limiting system 200 and/or the quantum circuit buffering system 202 can facilitate operation of plural quantum circuits 213 at least partially concurrently with one another. Further, the non-limiting system 200 and/or the quantum circuit buffering system 202 can employ one or more physical qubit layouts 219 based on one or more quantum logic circuits 228, such as of a quantum processor, such as quantum processor 226.

In one or more embodiments, a quantum logic circuit 228 can be virtually separated into two or more virtual machines comprising individual physical qubit layouts 219, based on a same quantum logic circuit or a same parent set of qubits of a same quantum processor.

The quantum circuit buffering system 202 can comprise a plurality of components. The components can include a memory 204, processor 206, bus 205, identification component 212, obtaining component 214, scheduler component 216 and/or training component 222. Like the quantum circuit buffering system 102, the quantum circuit buffering system 202 can be operated to facilitate a process for operation of plural quantum circuits at least partially in tandem with one another.

One or more communications between one or more components of the non-limiting system 200, and/or between an external system, and the non-limiting system 200, can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Discussion now turns to the processor 206, memory 204 and bus 205 of the quantum circuit buffering system 202.

For example, in one or more embodiments, quantum circuit buffering system 202 can comprise a processor 206 (e.g., computer processing unit, microprocessor, classical processor, quantum processor and/or like processor). In one or more embodiments, a component associated with quantum circuit buffering system 202, as described herein with or without reference to the one or more figures of the one or more embodiments, can comprise one or more computer and/or machine readable, writable and/or executable components and/or instructions that can be executed by processor 206 to facilitate performance of one or more processes defined by such component(s) and/or instruction(s). In one or more embodiments, the processor 206 can comprise identification component 212, obtaining component 214, scheduler component 216 and/or training component 222.

In one or more embodiments, the quantum circuit buffering system 202 can comprise a computer-readable memory 204 that can be operably connected to the processor 206. The memory 204 can store computer-executable instructions that, upon execution by the processor 206, can cause the processor 206 and/or one or more other components of the quantum circuit buffering system 202 (e.g., identification component 212, obtaining component 214, scheduler component 216 and/or training component 222) to perform one or more actions. In one or more embodiments, the memory 204 can store computer-executable components (e.g., identification component 212, obtaining component 214, scheduler component 216 and/or training component 222).

Quantum circuit buffering system 202 and/or a component thereof as described herein, can be communicatively, electrically, operatively, optically and/or otherwise coupled to one another via a bus 205 to perform functions of non-limiting system 200, quantum circuit buffering system 202 and/or one or more components thereof and/or coupled therewith. Bus 205 can comprise one or more of a memory bus, memory controller, peripheral bus, external bus, local bus, quantum bus and/or another type of bus that can employ one or more bus architectures. One or more of these examples of bus 205 can be employed to implement one or more embodiments described herein.

In one or more embodiments, quantum circuit buffering system 202 can be coupled (e.g., communicatively, electrically, operatively, optically and/or like function) to one or more external systems (e.g., a non-illustrated electrical output production system, one or more output targets, an output target controller and/or the like), sources and/or devices (e.g., classical and/or quantum computing devices, communication devices and/or like devices), such as via a network. In one or more embodiments, one or more of the components of the non-limiting system 200 can reside in the cloud, and/or can reside locally in a local computing environment (e.g., at a specified location(s)).

In addition to the processor 206 and/or memory 204 described above, quantum circuit buffering system 202 can comprise one or more computer and/or machine readable, writable and/or executable components and/or instructions that, when executed by processor 206, can facilitate performance of one or more operations defined by such component(s) and/or instruction(s).

Turning now to the additional components of the quantum circuit buffering system 202, generally, quantum circuits received and/or obtained can be stored at buckets. A bucket 215 can be a storage unit employed for temporary storage of a quantum circuit 213 or a copy thereof. A bucket 215 can be comprised by the memory 204 and/or can be separate therefrom. A bucket 215 can be "emptied" of a quantum circuit 213 upon compilation of the quantum circuit 213 into a composite circuit 217. In one or more embodiments, buckets 215 can be employed to temporarily store composite circuits 217. A composite circuit 217 can be a quantum circuit that consists of multiple smaller quantum circuits 213, thus allowing for maximizing usage of a quantum logic circuit 228. After operation of one or more counts/shots of a quantum circuit 213 and/or composite circuit 217, such quantum circuit 213 and/or composite circuit 217 can be deleted from the temporary storage bucket(s) 215. That is, the storage buckets 215 can be employed as an organization system of the quantum circuit buffering system 202.

Further, generally, when a bucket 215 is ready, circuits 213 in the bucket 215 can be combined and/or compiled into a composite circuit 217 and mapped and/or remapped to a physical qubit layout 219, which can be based on at least a portion of qubits 227 of the quantum logic circuit 228. Generally, as will be further detailed below, a bucket 215 can become ready when a percentage of qubits of a physical qubit layout 219 are to be used and/or on a time-based basis. Plural buckets 215 can be employed, such as to increase utilization of the quantum system 221 (e.g., of the quantum logic circuit 228).

Figure 3:
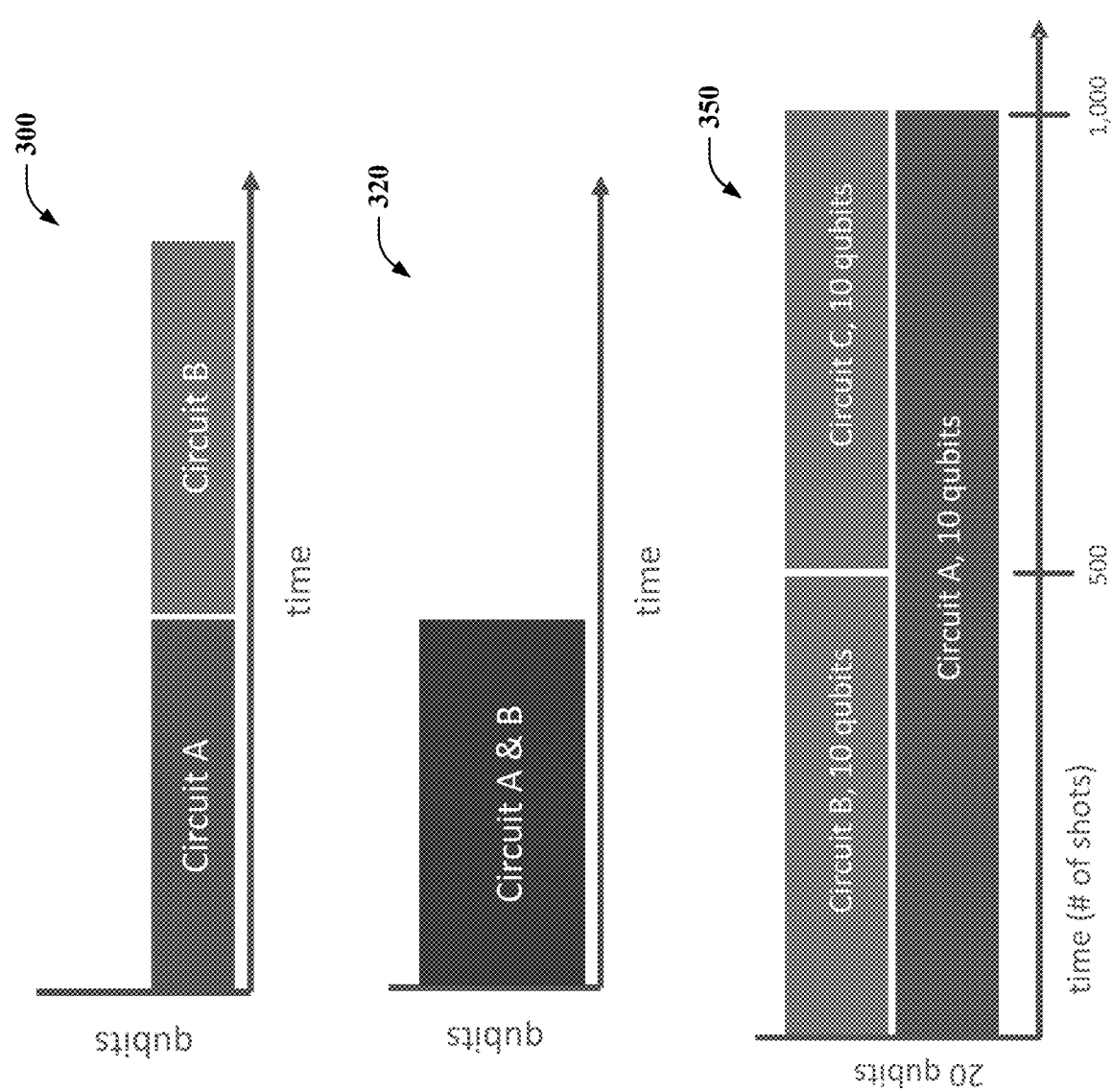
FIG. 3 illustrates three general plots of basic usage of a physical qubit layout, based on quantum circuit buffering performed by the non-limiting system of FIG. 2, in accordance with one or more embodiments described herein.

For example, turning briefly to FIG. 3, as illustrated at plots 300, 320 and 350, different quantum circuits A, B and/or C can be run in a single iteration of use of a quantum system. Different quantum circuits can employ varying resources, such as different numbers of qubits and/or qubits having particular hardware connection to one another. At plot 300, circuits A and B can be run back to back, such as employing at least one same qubit of a same quantum logic circuit. At plot 320, circuits A and B can be run concurrently with one another, such as on different qubits of a same quantum logic circuit. At plot 350, circuits B and C can be run back to back, and together can be run concurrently with circuit A, such as on different qubits of a same quantum logic circuit (e.g., circuits B/C vs. circuit A). Further, relative to plot 350, the different circuits A, B and C each can be run a plurality of times, such as back to back, in a plurality of shots. In this way, plural quantum measurements can be obtained to account for variances of different shots.

Turning now to the identification component 212, the identification component can locate a quantum circuit 213, such as based on a quantum job request 224. The quantum job request 224 can be provided in any suitable format, such as text, binary and/or the like. The quantum circuit 213 can be comprised by the quantum job request 224 and/or can be stored internally and/or externally to the quantum circuit buffering system 202 and/or non-limiting system 200.

The obtaining component 214 can receive, download, transfer, upload and/or otherwise obtain the quantum circuit 213. The obtaining component 214 further can assign the quantum circuit 213 to a bucket 215. In one or more embodiments, the obtaining component 214 can determine that a bucket 215 is ready for analysis by the scheduler component 216. A state of readiness can be based on meeting one or more thresholds such that the scheduler component 216 can proceed to analyze the quantum circuit(s) 213 from the ready bucket 215. This initial threshold can be based on any one or more of number of qubits employed and or time that a bucket has been at least partially filled and waiting for further processing. In one or more other embodiments, the initial threshold can be based on any one or more of quantity of qubits to employ, number of shots to run, number of gates (e.g., swap gates) to be employed, execution time of a quantum circuit as compared to coherency time of qubits employed, circuit length/depth, time of a quantum circuit in a queue, hardware constraints, level of a user entity or customer, and/or the like.

The scheduler component 216 generally can facilitate mapping and/or remapping of the bucketed quantum circuits relative to one or more physical qubit layouts 219. The physical qubit layout(s) 219 can be stored internally and/or externally to the quantum circuit buffering system 202 and/or non-limiting system 200. The physical qubit layout(s) 219 can be dynamically altered, such as by the quantum system 221, based upon current status of qubits 227 of a quantum logic circuit 228 thereof.

As indicated above, the scheduler component 216 can compile a composite circuit 217, comprising the quantum circuit and at least one other quantum circuit that are to be executed together at the physical qubit layout 219. The mapping executed by the scheduler component 216 can be at least partially based on a number of gates to be employed by the scheduler component 216 to execute the mapping as compared to a number of gates of the quantum circuit(s) 213 prior to execution of the mapping. The mapping executed by the scheduler component 216 can be at least partially based on a comparison of execution time of the quantum circuit(s) as compared to a coherency time of the physical qubit layout 219. Such coherency time can be based on historical activity and/or can be based on individual qubit coherencies. Basing a threshold on number of shots can, in one or more embodiments, save on various overhead, such as from otherwise additional initialization of instruments, qubits and/or related components of a quantum system across multiple quantum program jobs (e.g., each requesting operation of one or more quantum circuits).

In one or more embodiments, remapping can comprise adding additional gates, such as swaps to fit the quantum circuit(s) 213 on the physical qubit layout 219. Adding gates can make a composite circuit 217 longer, however, can also allow smaller quantum circuits 213 to run on a large quantum system (e.g., having more qubits than employed by any one quantum circuit 213) efficiently, and/or can reduce a number of swap gates employed. In one example, a 5-qubit quantum circuit compiled for a 5-qubit machine may contain many swaps due to connectivity (e.g., hardware connectivity). The number of swaps can be reduced if the same quantum circuit is compiled for a larger machine with better connectivity.

In a case where plural buckets 215 are employed by the quantum circuit buffering system 202, the scheduler component 216 can analyze one or more buckets 215, such as each bucket 215, in any suitable order (and/or one or more concurrently) to find a combination of quantum circuits 213 to employ. The combination of quantum circuits 213 can be from a single bucket 215 or from plural buckets 215.

In one or more embodiments, a similar process can be employed where a single large bucket is employed. In such example, one or more quantum circuits 213 can be selected, such as heuristically to form a composite circuit 217. Any one or more of the aforementioned thresholds can be employed.

In one or more embodiments, the scheduler component 216 can employ one or more algorithms to perform the napping and/or remapping. That is, historical data of quantum circuits employed and corresponding mappings utilized can be used as algorithm input.

In one or more embodiments, the scheduler component 216 can employ a machine learning (ML) model to perform the napping and/or remapping. That is, historical data of quantum circuits employed and corresponding mappings utilized can be used to train the ML model. The ML model can be further trained, such as by the training component 222, such as after each iteration of running of a composite circuit 217, and/or after numerous operated shots of a composite circuit 217 and/or portions thereof.

In one or more embodiments, the scheduler component 216 can map one or more quantum circuits 213 and/or a composite circuit 217 to a physical qubit layout 219, while operating generally independent of the physical qubit layout 219, other than the total number of available qubits of the physical qubit layout 219. For example, the scheduler component 216 can map absent consideration of hardware connections and/or other connectivity factors and/or constraints between and/or among the qubits of the physical qubit layout 219.

Figure 4:
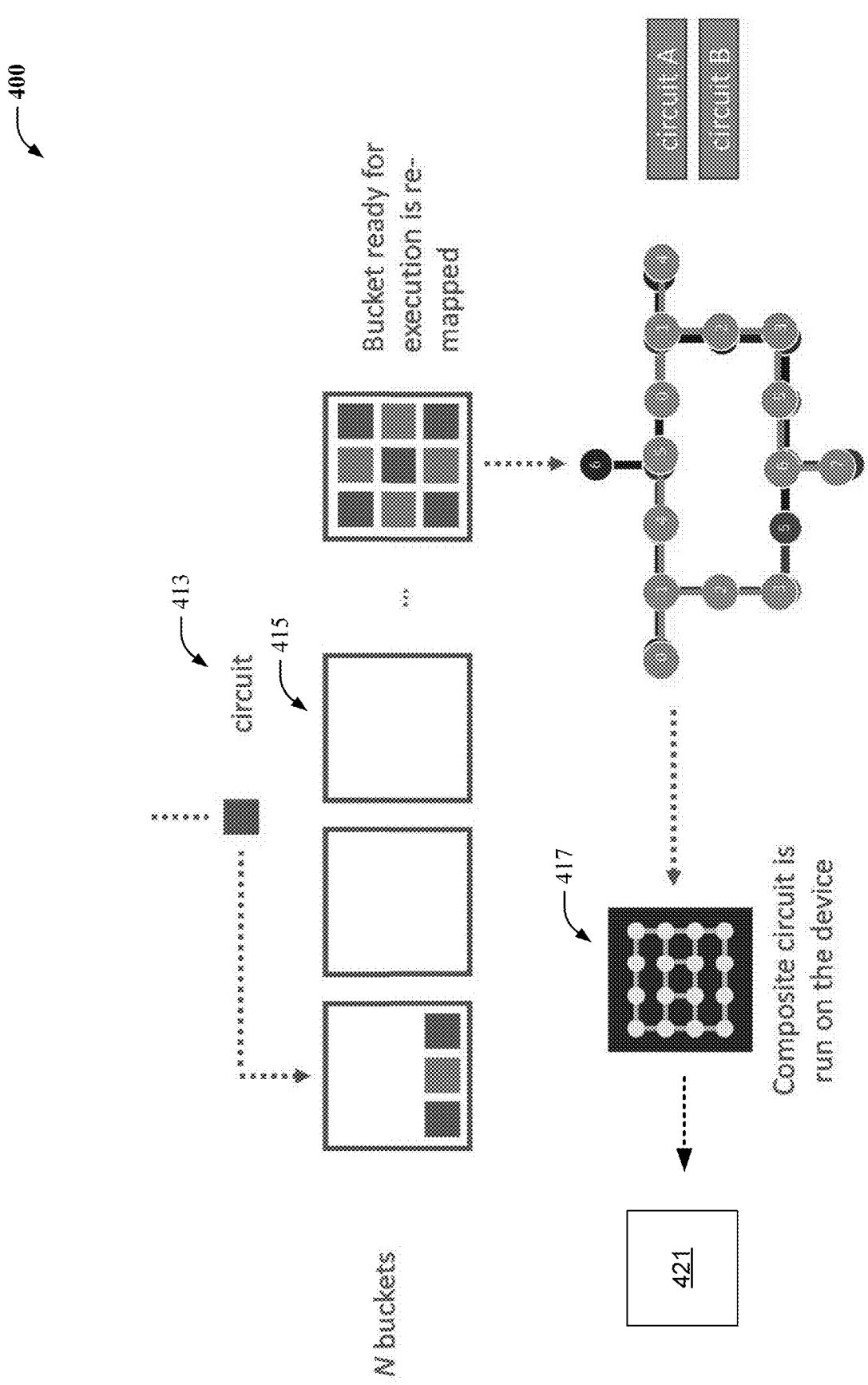
FIG. 4 illustrates a schematic diagram of an exemplary generation of quantum circuit mapping, in accordance with one or more embodiments described herein.
Figure 5:
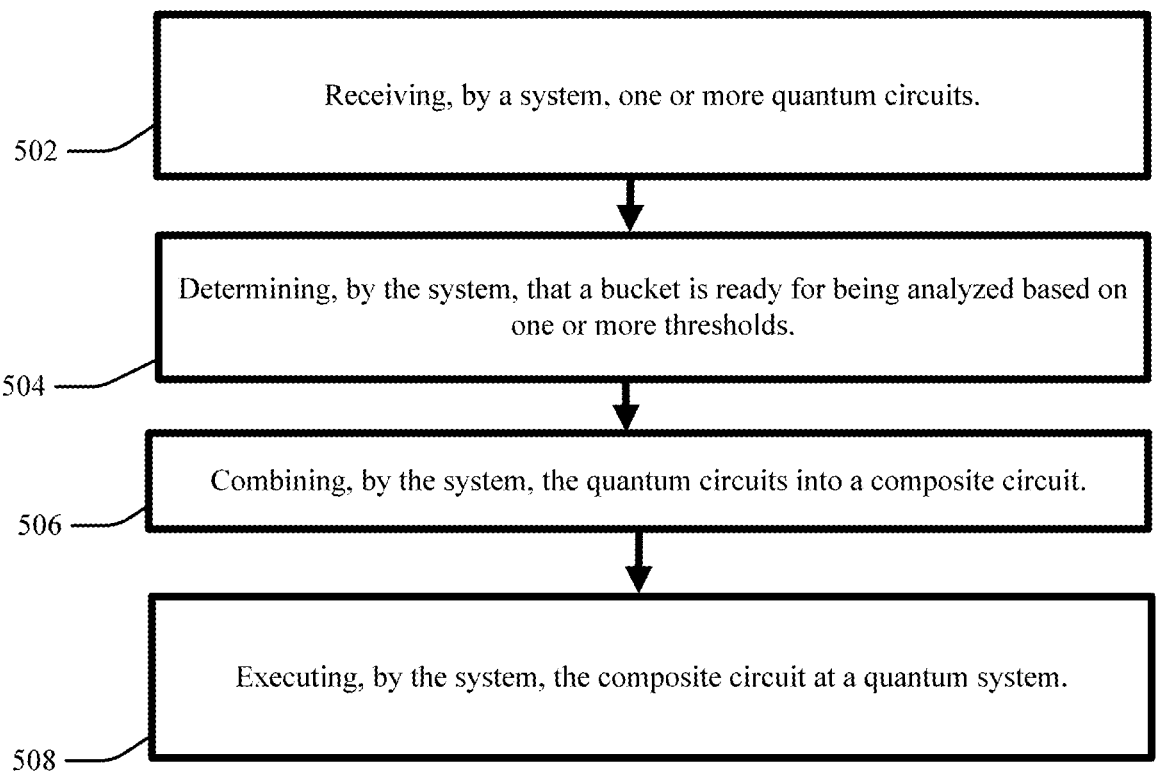
FIG. 5 illustrates a process flow for facilitating quantum circuit buffering based on the schematic diagram of FIG. 4, in accordance with one or more embodiments described herein.

Referring next to FIG. 4, illustrated is a schematic diagram 400 of operations that can employ the non-limiting system 200 and/or quantum circuit buffering system 202 of FIG. 2. Referring also to FIG. 5, provided is a process flow 500 based on the schematic diagram 400 of FIG. 4. Description is provided in accordance with one or more embodiments described herein, such as the non-limiting 200 of FIG. 2. While the process flow 500 is described relative to the non-limiting system 200 of FIG. 2, the process flow 500 can be applicable also to other systems described herein, such as the non-limiting system 100 of FIG. 1. Repetitive description of like elements and/or processes employed in respective embodiments is omitted for sake of brevity.

At 502, the non-limiting method 500 can comprise receiving, by a system (e.g., quantum circuit buffering system 202), one or more quantum circuits (e.g., quantum circuits 413).

At 504, the non-limiting method 500 can comprise determining, by the system (e.g., obtaining component 214 of quantum circuit buffering system 202), that a bucket (e.g., bucket 415) is ready for being analyzed based on one or more thresholds.

At 506, the non-limiting method 500 can comprise combining, by the system (e.g., scheduler component 216 of quantum circuit buffering system 202), the quantum circuits (e.g., quantum circuits 413) into a composite circuit (e.g., composite circuit 417).

At 508, the non-limiting method 500 can comprise executing, by the system (e.g., non-limiting system 200), the composite circuit (e.g., composite circuit 417) at a quantum system (e.g., quantum system 421).

Figure 6:
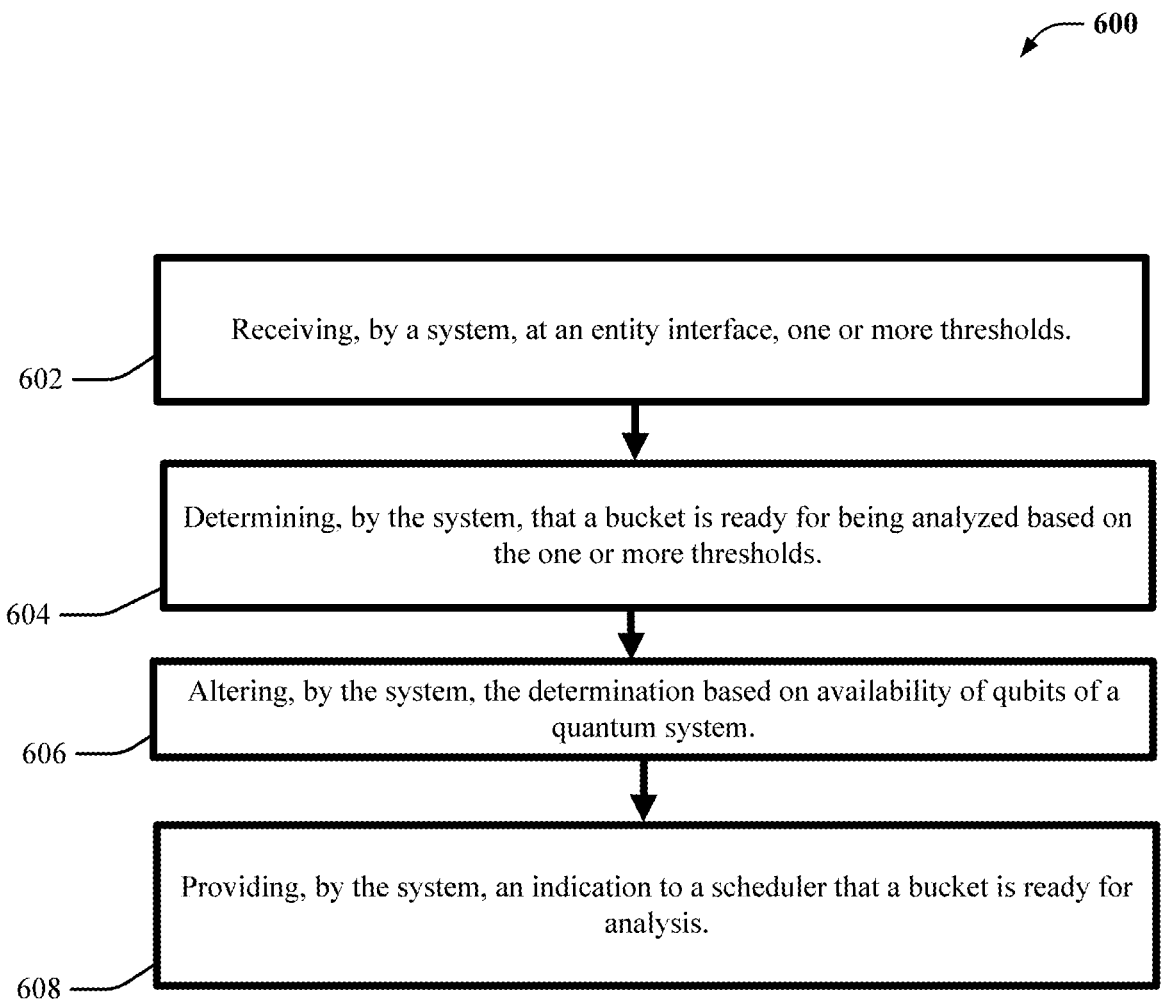
FIG. 6 illustrates a process flow for facilitating quantum circuit organization, in accordance with one or more embodiments described herein.

Turning next to FIG. 6, illustrated is a schematic diagram 600 depicting an example, non-limiting method 600 that can facilitate determination of bucket readiness, in accordance with one or more embodiments described herein, such as the non-limiting 200 of FIG. 2. While the non-limiting method 600 is described relative to the non-limiting system 200 of FIG. 2, the non-limiting method 600 can be applicable also to other systems described herein, such as the non-limiting system 100 of FIG. 1. Repetitive description of like elements and/or processes employed in respective embodiments is omitted for sake of brevity.

At 602, the non-limiting method 600 can comprise receiving, by a system (e.g., quantum circuit buffering system 202) at an entity interface one or more thresholds.

At 604, the non-limiting method 600 can comprise determining, by the system (e.g., obtaining component 214 of quantum circuit buffering system 202), that a bucket is ready for being analyzed based on the one or more thresholds.

At 606, the non-limiting method 600 can comprise altering, by the system (e.g., obtaining component 214 of quantum circuit buffering system 202), the determination based on availability of qubits of a quantum system (e.g., quantum system 221).

At 608, the non-limiting method 600 can comprise providing an indication, by the system (e.g., obtaining component 214 of quantum circuit buffering system 202), to a scheduler (e.g., scheduler component 216 of a quantum circuit buffering system 202) that a bucket is ready for analysis.

Figure 7:
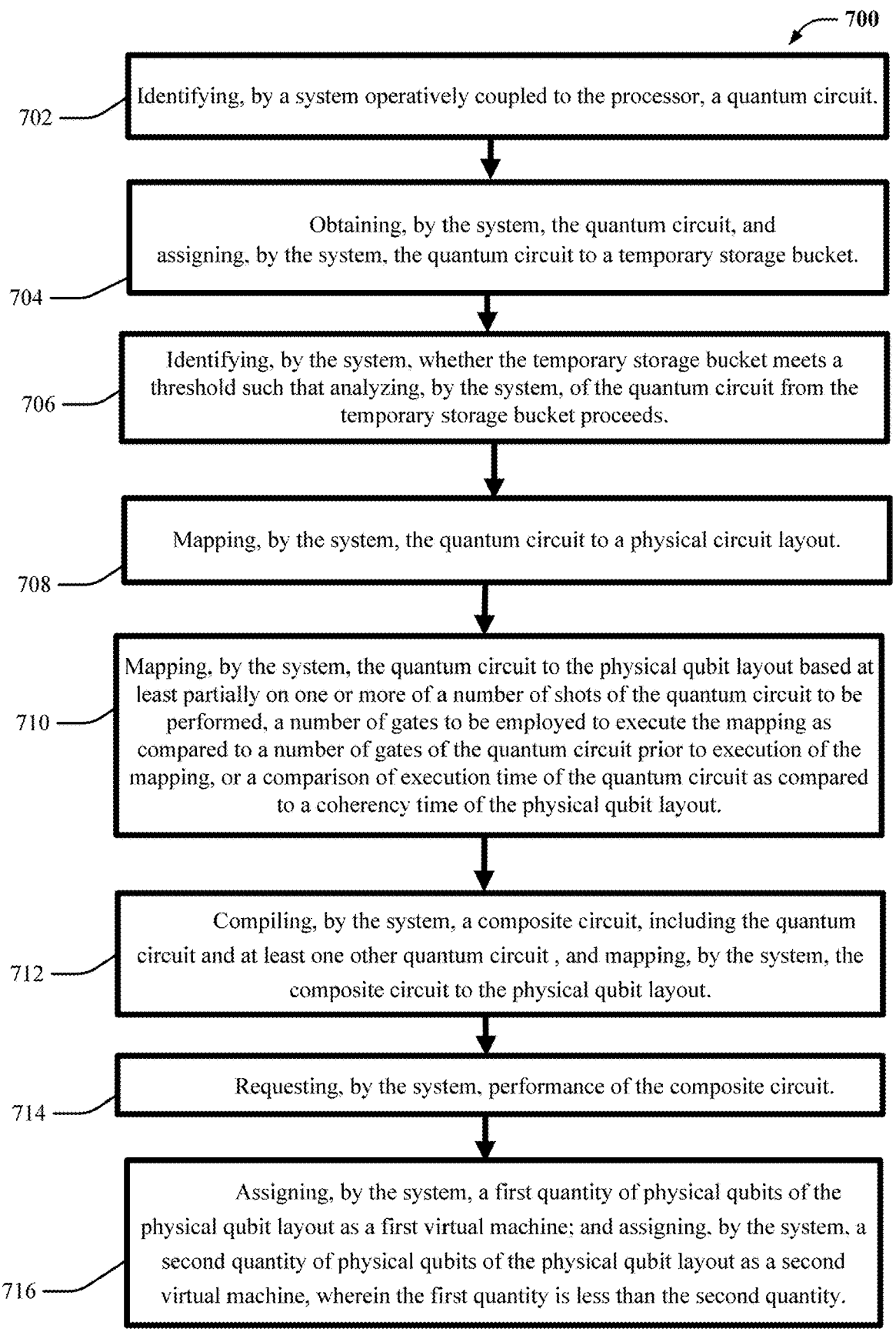
FIG. 7 illustrates a process flow for facilitating buffering of one or more quantum circuits, in accordance with one or more embodiments described herein.

Next, FIG. 7 illustrates a flow diagram of an example, non-limiting method 700 that can facilitate generation of a decision policy, in accordance with one or more embodiments described herein, such as the non-limiting 200 of FIG. 2. While the non-limiting method 700 is described relative to the non-limiting system 200 of FIG. 2, the non-limiting method 700 can be applicable also to other systems described herein, such as the non-limiting system 100 of FIG. 1. Repetitive description of like elements and/or processes employed in respective embodiments is omitted for sake of brevity.

At 702, the non-limiting method 700 can comprise identifying, by a system (e.g., identification component 212 of quantum circuit buffering system 202) operatively coupled to the processor, a quantum circuit.

At 704, the non-limiting method 700 can comprise obtaining, by the system (e.g., obtaining component 214 of quantum circuit buffering system 202), the quantum circuit, and assigning, by the system, the quantum circuit to a temporary storage bucket.

At 706, the non-limiting method 700 can comprise identifying, by the system (e.g., obtaining component 214 of quantum circuit buffering system 202), whether the temporary storage bucket meets a threshold such that analyzing, by the system, of the quantum circuit from the temporary storage bucket proceeds.

At 708, the non-limiting method 700 can comprise mapping, by the system (e.g., scheduler component 216 of quantum circuit buffering system 202), the quantum circuit to a physical circuit layout.

At 710, the non-limiting method 700 can comprise mapping, by the system (e.g., scheduler component 216 of quantum circuit buffering system 202), the quantum circuit to the physical qubit layout based at least partially on one or more of a number of shots of the quantum circuit to be performed, a number of gates to be employed to execute the mapping as compared to a number of gates of the quantum circuit prior to execution of the mapping, or a comparison of execution time of the quantum circuit as compared to a coherency time of the physical qubit layout.

At 712, the non-limiting method 700 can comprise compiling, by the system (e.g., scheduler component 216 of quantum circuit buffering system 202), a composite circuit, including the quantum circuit and at least one other quantum circuit, and mapping, by the system, the composite circuit to the physical qubit layout (e.g., physical qubit layout 219).

At 714, the non-limiting method 700 can comprise requesting, by the system (e.g., scheduler component 216 of quantum circuit buffering system 202), performance of the composite circuit.

At 716, the non-limiting method 700 can comprise at least partially based on a variable of the quantum circuit, assigning, by the system (e.g., scheduler component 216 of quantum circuit buffering system 202), a first quantity of physical qubits of the physical qubit layout as a first virtual machine, and assigning, by the system (e.g., scheduler component 216 of quantum circuit buffering system 202), a second quantity of physical qubits of the physical qubit layout as a second virtual machine, wherein the first quantity is less than the second quantity.

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, one or more systems, devices, computer program products and/or computer-implemented methods of use provided herein relate to usage maximization of a physical qubit layout of a quantum computer. A system can comprise a memory that stores computer executable components, and a processor that executes the computer executable components stored in the memory, wherein the computer executable components can comprise an identification component that identifies a quantum circuit, and a scheduler component that maps the quantum circuit to a physical qubit layout. In an embodiment, the scheduler component can combine plural quantum circuits, including the quantum circuit into a composite circuit, and map the composite circuit to the physical qubit layout. In an embodiment, an obtaining component can assign the quantum circuit to a temporary storage bucket and can identify whether the temporary storage bucket meets a threshold where the scheduler component can proceed to analyze the quantum circuit.

Generally, the one or more systems, devices, computer program products and/or computer-implemented methods of use provided herein can optimize operation of running quantum circuits, such as by finding a low cost pattern using a library of templates for a physical qubit layout.

An advantage of the aforementioned system, computer-implemented method and/or computer program product can be an increase in general overall throughput of a quantum system employing such embodiment, as compared to operation of one quantum program at a time. Indeed, use of physical qubits can be increased both by increasing number of qubits and by increasing available coherency time employed of one or more qubits of such quantum system.

Another advantage can be employment of one or more thresholds based on the quantum circuits, based on a hold time, and/or based on the entity requesting operation can be employed. One or more such thresholds can be employed concurrently, and threshold basis can be dynamically selectively altered. In this way, a most efficient usage of a quantum system can be provided, while providing a level of quantified fairness to user entities requesting usage of the quantum system. Indeed, such balancing can be desired in a case where a physical qubit layout exceeds ten or more qubits, such as comprising even a thousand or more qubits.

Another advantage can be restriction of open access to quantum circuits based on qubit size and or shots at an increased quantity as compared to existing technologies. Smaller quantum circuits can then be combined and operated on larger quantum processors (e.g., which can comprise the quantum logic circuit(s)). This can allow for maintenance of fewer but larger quantum systems.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to quantum circuit mapping and/or re-mapping to a physical qubit layout. Systems, computer-implemented methods and/or computer program products facilitating performance of these processes are of great utility in the field of quantum computing and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively map a quantity of quantum circuits efficiently, balancing plural factors, in a timescale as the one or more embodiments described herein can facilitate this process. And, neither can the human mind nor a human with pen and paper electronically effectively efficiently, accurately and/or effectively map a quantity of quantum circuits efficiently, balancing plural factors, in a timescale, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing one or more of the one or more operations, such as quantum and/or non-quantum operations, described and/or not specifically described herein.

Figure 8:
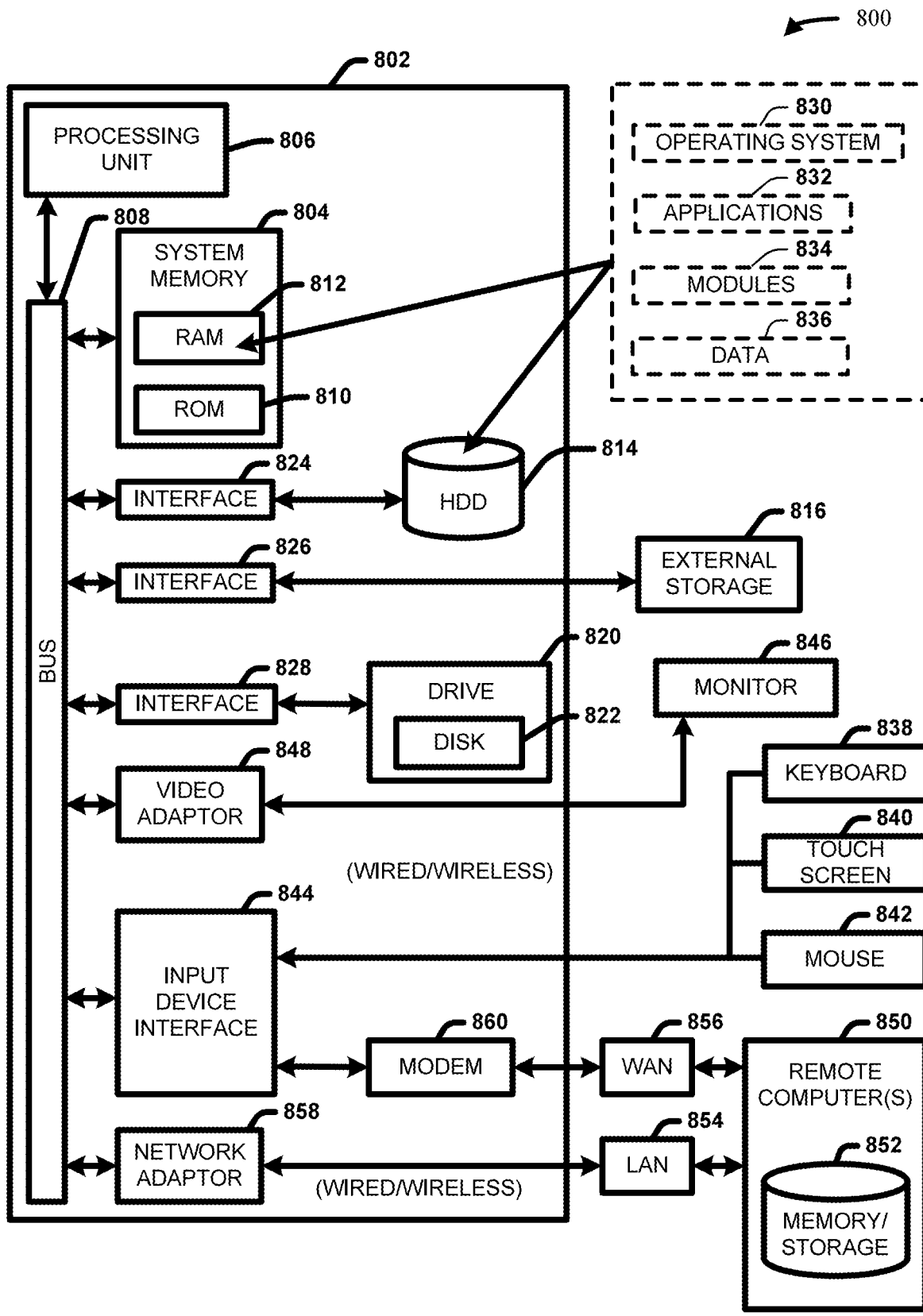
FIG. 8 illustrates a block diagram of an example, non-limiting, operating environment in which one or more embodiments described herein can be facilitated.
Figure 9:
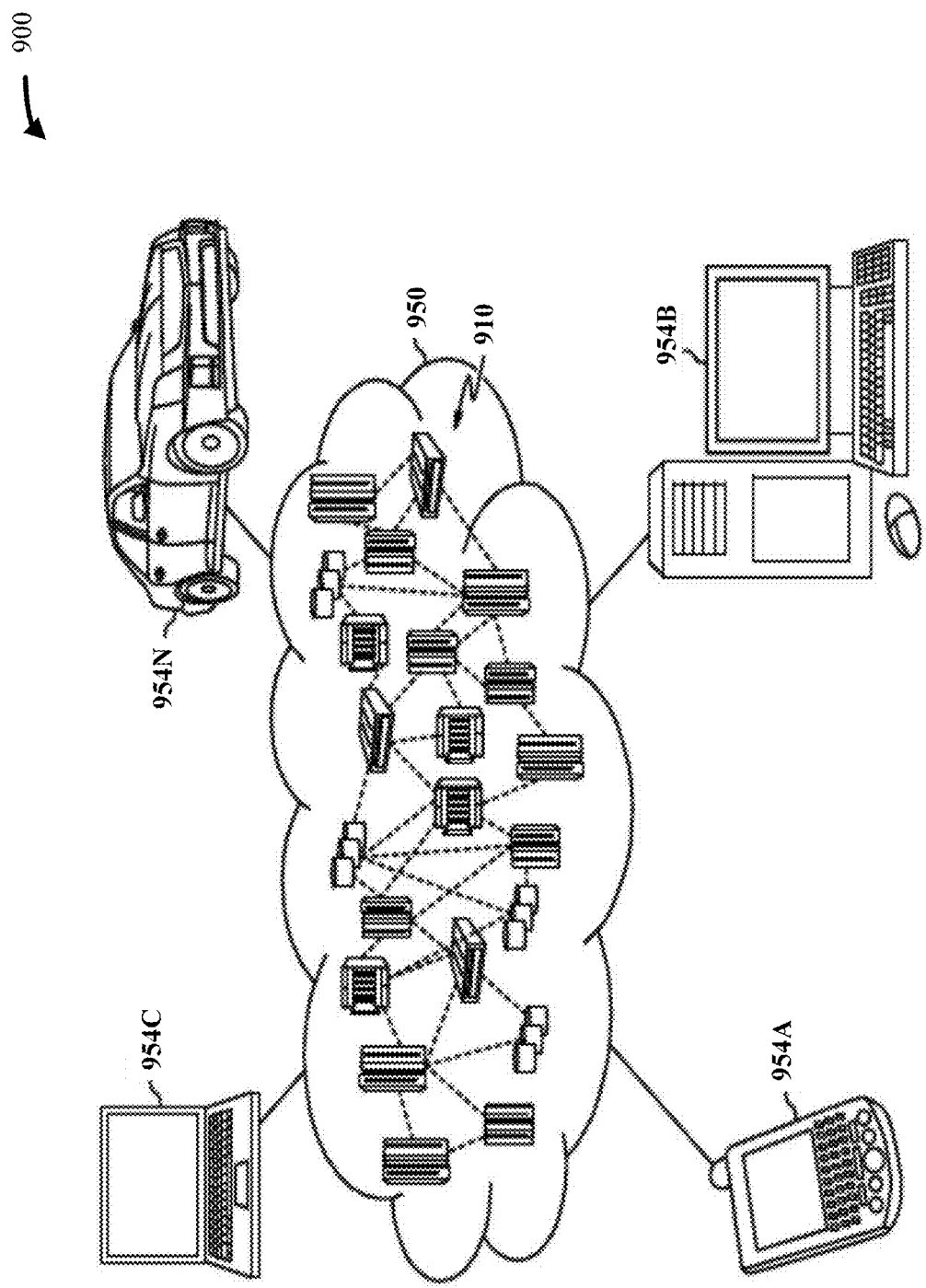
FIG. 9 illustrates a block diagram of an example, non-limiting, cloud computing environment in accordance with one or more embodiments described herein.
Figure 10:
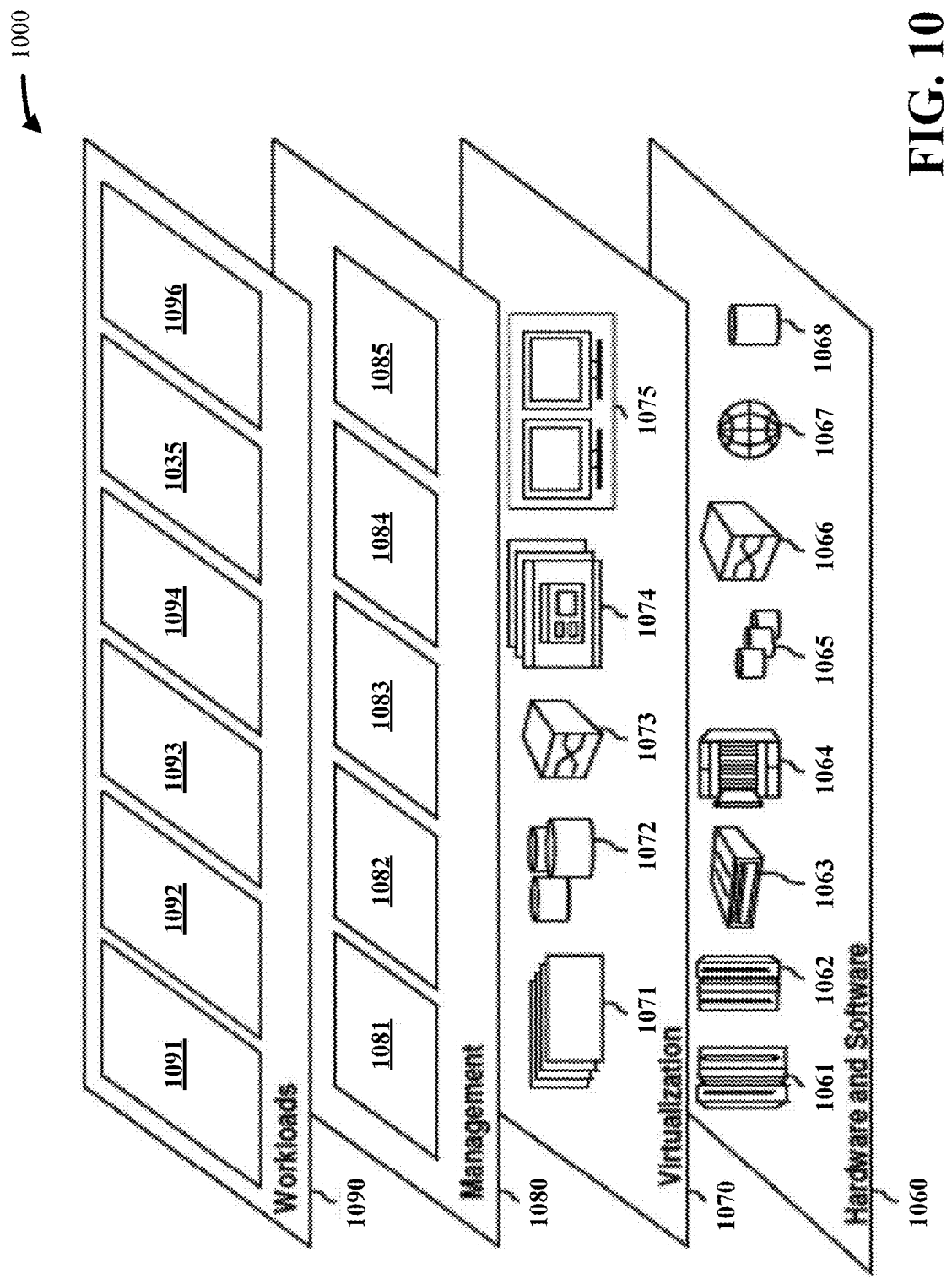
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other aspects of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the aforedescribed methods can be practiced with other computer system configurations, including single-processor or multiprocessor computer systems, mini-computers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference still to FIG. 8, the example operating environment 800 for implementing one or more embodiments of the aspects described herein can include a computer 802, the computer 802 including a processing unit 806, a system memory 804 and/or a system bus 808. One or more aspects of the processing unit 806 can be applied to processors such as 106 and/or 206 of the non-limiting systems 100 and/or 200. The processing unit 806 can be implemented in combination with and/or alternatively to processors such as 106 and/or 206.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100 and/or non-limiting system 200, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a pre-defined structure as with a conventional network or simply an ad hoc communication between at least two devices.

The illustrated embodiments described herein can be employed relative to distributed computing environments (e.g., cloud computing environments), such as described below with respect to FIG. 13, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 1950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 19). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A system, comprising:
a memory that stores computer executable components; and
a processor that executes at least one of the computer executable components that:
obtains a quantum circuit;
assigns the quantum circuit to a temporary storage bucket; and
in response to determining that the temporary storage bucket meets a defined threshold, maps the quantum circuit to a physical qubit layout of qubits of a quantum system.

2. The system of claim 1, wherein the at least one of the computer executable components further:
compiles a composite circuit comprising the quantum circuit and at least one other quantum circuit from the temporary storage bucket, and wherein the mapping the quantum circuit comprises mapping the composite circuit to the physical qubit layout instead of the quantum circuit.

3. The system of claim 1, wherein the mapping is at least partially based on a number of shots of the quantum circuit to be performed.

4. The system of claim 1, wherein the mapping is at least partially based on a number of gates to be employed to execute the mapping as compared to a number of gates of the quantum circuit prior to execution of the mapping.

5. The system of claim 1, wherein the mapping is at least partially based on a comparison of execution time of the quantum circuit as compared to a coherency time of the physical qubit layout.

6. The system of claim 1, wherein the at least one of the computer executable components further:
at least partially based on a variable of the quantum circuit:
assigns a first quantity of physical qubits of the physical qubit layout as a first virtual machine; and
assigns a second quantity of physical qubits of the physical qubit layout as a second virtual machine, and wherein the first quantity is less than or equal to the second quantity.

7. The system of claim 1, wherein the defined threshold comprises a total quantity of qubits needed for operation of quantum circuits in the temporary storage bucket meeting a defined percentage of the qubits of the quantum system.

8. The system of claim 1, wherein the defined threshold comprises a defined amount of time that the temporary storage bucket contains at least one quantum circuit.

9. A computer-implemented method, comprising:
identifying, by a system operatively coupled to a processor, a quantum circuit;
mapping, by the system, the quantum circuit to a physical circuit layout of qubits of a quantum system; and
at least partially based on a variable of the quantum circuit, assigning, by the system, a first quantity of the qubits as a first virtual machine and a second quantity of the qubits as a second virtual machine, wherein the first quantity is less than or equal to the second quantity.

10. The computer-implemented method of claim 9, further comprising:
assigning, by the system, the quantum circuit to a temporary storage bucket.

11. The computer-implemented method of claim 10, further comprising:
determining, by the system, whether the temporary storage bucket meets a defined threshold such that the mapping, by the system, of the quantum circuit from the temporary storage bucket proceeds.

12. The computer-implemented method of claim 11, further comprising:
in response to determining that the temporary storage bucket meets the defined threshold:
compiling, by the system, a composite circuit comprising the quantum circuit and at least one other quantum circuit from the temporary storage bucket, and wherein the mapping the quantum circuit comprises mapping the composite circuit to the physical circuit layout instead of the quantum circuit.

13. The computer-implemented method of claim 9, wherein the mapping is based at least partially on a number of shots of the quantum circuit to be performed.

14. The computer-implemented method of claim 9, wherein the mapping is based at least partially on a number of gates to be employed to execute the mapping as compared to a number of gates of the quantum circuit prior to execution of the mapping.

15. The computer-implemented method of claim 9, wherein the mapping is based at least partially on a comparison of execution time of the quantum circuit as compared to a coherency time of the physical qubit layout.

16. A computer program product facilitating a process to buffer one or more quantum circuits, the computer program product comprising a non-transitory computer readable medium having program instructions embodied therewith, the program instructions executable by a processor to cause the processor to:
- identify, by the processor, a quantum circuit; and
- map, by the processor, the quantum circuit to a physical qubit layout of qubits of a quantum system based at least partially on at least one of a number of shots of the quantum circuit to be performed, a number of gates to be employed to execute the mapping as compared to a number of gates of the quantum circuit prior to execution of the mapping, or a comparison of execution time of the quantum circuit as compared to a coherency time of the physical qubit layout.

17. The computer program product of claim 16, wherein the program instructions are further executable by the processor to cause the processor to:
- assign, by the processor, the quantum circuit to a temporary storage bucket.

18. The computer program product of claim 17, wherein the program instructions are further executable by the processor to cause the processor to:
- determine, by the processor, whether the temporary storage bucket meets a defined threshold such that, the mapping of the quantum circuit from the temporary storage bucket proceeds.

19. The computer program product of claim 18, wherein the program instructions are further executable by the processor to cause the processor to:
- in response to determining that the temporary storage bucket meets the defined threshold:
  - compile, by the processor, a composite circuit comprising the quantum circuit and at least one other quantum circuit from the temporary storage bucket, and
  - wherein the mapping the quantum circuit comprises mapping the composite circuit to the physical qubit layout instead of the quantum circuit.

20. The computer program product of claim 16, wherein the program instructions are further executable by the processor to cause the processor to:
- at least partially based on a variable of the quantum circuit:
  - assign, by the processor, a first quantity of the qubits as a first virtual machine; and
  - assign, by the processor, a second quantity of the qubits as a second virtual machine, wherein the first quantity is less than or equal to the second quantity.

* * * * *